United States Patent [19]

Tran

[11] Patent Number: 5,144,168
[45] Date of Patent: Sep. 1, 1992

[54] SELF LATCHING INPUT BUFFER
[75] Inventor: Hiep V. Tran, Carrollton, Tex.
[73] Assignee: Texas Instruments Incorporated, Dallas, Tex.
[21] Appl. No.: 799,872
[22] Filed: Nov. 26, 1991

Related U.S. Application Data

[63] Continuation of Ser. No. 569,359, Aug. 17, 1990, abandoned.

[51] Int. Cl.[5] .................. H03K 19/0175; H03K 0/96
[52] U.S. Cl. ...................................... 307/475; 307/481
[58] Field of Search ........................ 307/475, 452–453, 307/480–481; 365/230.08

[56] References Cited

U.S. PATENT DOCUMENTS

| 4,436,791 | 3/1984 | Gingerich | 365/230.08 |
|---|---|---|---|
| 4,451,745 | 5/1984 | Itoh et al. | 307/481 |
| 4,458,337 | 7/1984 | Takemae et al. | 365/230.08 |
| 4,825,420 | 4/1989 | Min | 365/230.08 |
| 4,951,258 | 8/1990 | Uehara | 365/230.08 |
| 4,970,694 | 11/1990 | Tanaka et al. | 365/230.08 |
| 4,985,868 | 1/1991 | Nakano et al. | 365/230.08 |
| 4,986,666 | 1/1991 | Homma et al. | 365/230.08 |
| 5,003,513 | 3/1991 | Porter et al. | 365/230.08 |

Primary Examiner—David Hudspeth
Assistant Examiner—Andrew Sanders
Attorney, Agent, or Firm—Stanton C. Braden; Richard L. Donaldson; William E. Hiller

[57] ABSTRACT

A self latching input buffer is disclosed which includes an address input buffer which is responsive to a first clock signal so as to produce an output signal. Data in the input buffer is latched in connection with the receipt of a second clock signal which is produced by a detector which is responsive to the output signal.

5 Claims, 3 Drawing Sheets

SELF LATCHING INPUT BUFFER

This application is a continuation of application Ser. No. 07/569,359, filed Aug. 17, 1990, now abandoned.

FIELD OF THE INVENTION

This invention relates to a self latching input buffer which is particularly well suited for a high density random access memory such as a 64 megabit dynamic random access memory.

BACKGROUND OF THE INVENTION

As densities of memories increase it is important that power consumption be minimized and that memory timing schemes be maximized to ensure good speed and efficiency of memory operation.

FIG. 1a illustrates a block diagram of a conventional dynamic random access memory (DRAM) multiplexing input buffer circuit which may lie on an intergrated circuit chip. As shown, input buffer 2 for receiving a row address selection (RAS) signal is connected to a node, such as bond pad 3, for receiving address signal ADD. Likewise, input buffer 4 for receiving a column address selection (CAS) signal is connected to the same node, or rather bond pad 3. The output from RAS input buffer 2 is transmitted to and decoded by a row decoder (not shown). In a similar manner, the output from CAS input buffer 4 is transmitted to and decoded by a column decoder (not shown). Alternatively, the outputs of buffers 2 and 4 may be sent to other circuitry internal to the memory, i.e. a driver preceding a row decoder and etc. The address placed on bond pad 3 is multiplexed to either RAS input buffer 2 or CAS input buffer 4 in connection with clock signals 0RAS1 and 0CAS1 to their respective input buffers. For instance, when 0RAS1 is at a logic high level, RAS input buffer 2 will accept the address information from bond pad 3. Similarly, CAS input buffer 4 accepts address information from bond pad 3 when 0CAS1 is at a high level. Information to the respective input buffers is latched in connection with the receipt of second clock signals 0RAS2 and 0CAS2. For example, RAS input buffer 2 latches the address presented at bond pad 3 when it receives a logic high 0RAS2 signal. Likewise, CAS input buffer 4 latches the address presented at bond pad 3 upon receipt of a logic high 0CAS2 signal. Thus, an input buffer, after latching the information from bond pad 3 will n longer respond to further address changes. Additionally, upon latching its information, the buffer will turn off to avoid further d.c. power consumption. Clock signals 0RAS1 and 0RAS2 are generated by a clock 6. Additionally, clock signals 0CAS1 and 0CAS2 are generated by a clock 8.

In order to explain the problems associated with prior art input buffer circuits, reference shall now be made to FIG. 1b which illustrates a timing diagram for operation of the circuit shown in FIG. 1a. Clock signals 0RAS1, 0RAS2, 0CAS1, 0CAS2 and address signal ADD are shown changing between logic high levels, represented by $V_H$, to logic low levels, represented by $V_L$, with respect to time. An arrow from one graph to another indicates that the signal associated with the graph from which the arrow terminates, is derived from the signal associated with the graph from which the arrow originates. For example, 0RAS2 is derived from 0RAS1, and 0CAS2 is derived from 0CAS1. Thus, clock 6 must generate a timing delay between signals 0RAS1 and 0RAS2. Similarly, clock 8 must generate a timing delay between signals 0CAS1 and 0CAS2. These timing delays between clock signals for each input buffer are derived without feedback from the input buffers. Prior art schemes which implement a timing delay between clock signals to an input buffer have consisted of circuitry which inherently loads the clock. This heavy loading results in timing delays between the 0RAS1 and 0RAS2 signals as well as between the 0CAS1 and 0CAS2 signals which are not accurate. Such inaccuracies can result in unnecessary delay which slows the overall operation of the memory and more specifically, input buffer operation.

OBJECTS OF THE INVENTION

It is an object of the invention to provide a new and improved input buffer.

It is another object of the invention to provide a new and improved input buffer which is self latching.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are accomplished by a self latching input buffer.

BRIEF DESCRIPTION OF THE DRAWINGS

FIG. 1b illustrates a timing diagram for the diagram of FIG. 1a.

DETAILED DESCRIPTION OF THE INVENTION

Figure 1A:
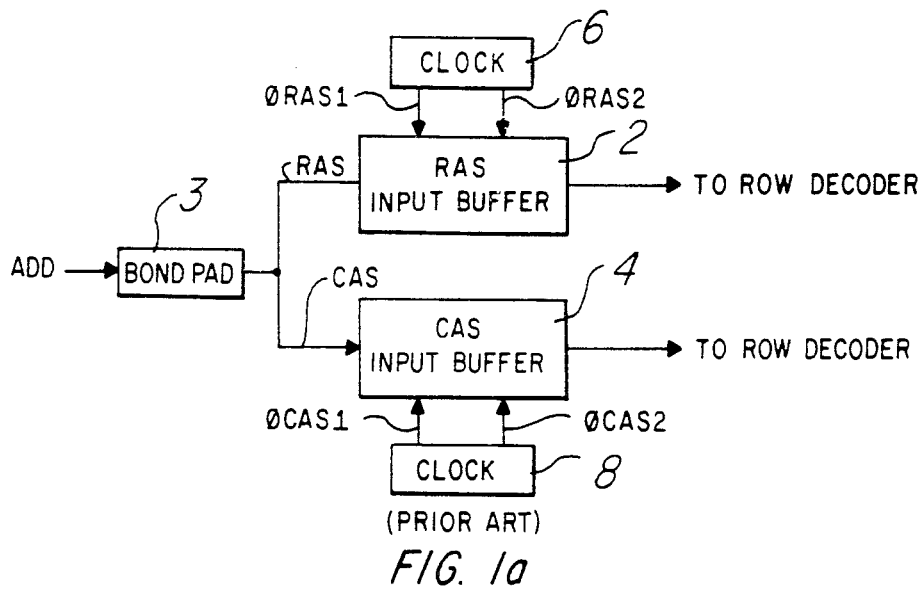
FIG. 1a illustrates a block diagram of a conventional dynamic random access memory multiplexing input buffer.
Figure 2:
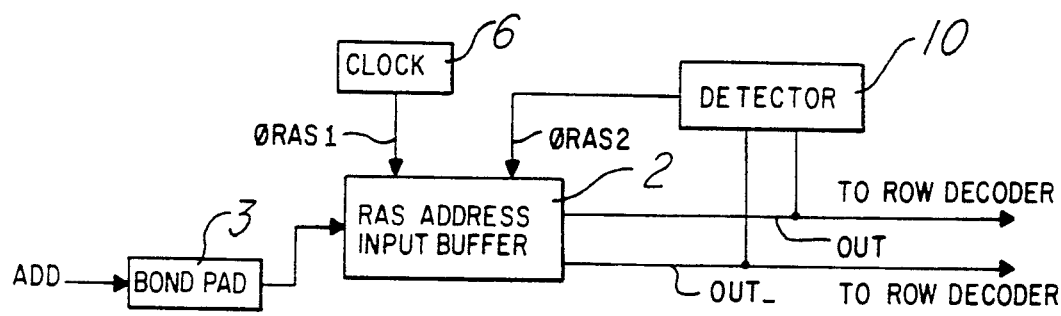
FIG. 2 illustrates a block diagram of the invention's self latching input buffer circuit.

FIG. 2 illustrates a block diagram of the invention's self latching input buffer circuit. As with the circuit of FIG. 1a, RAS input buffer 2 receives address ADD from bond pad 3 in connection with a clock signal. For instance, buffer 2 receives address ADD from bond pad 3 when 0RAS1, from clock 6, is at a logic high level. The output of RAS input buffer 2 is received by detector 10. Note that the output of RAS input buffer 2 includes two outputs, true output OUT and its complement, output OUT_, both of which are also received by a row decoder (not shown) and perhaps other circuitry internal to the memory. Detector 10 produces latching clock signal 0RAS2 from the true and complement outputs of RAS address input buffer 2 after detecting the receipt of such outputs.

Figure 3:
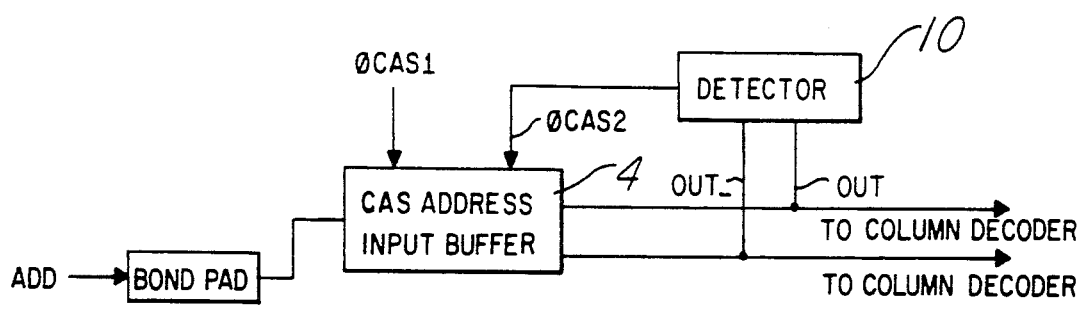
FIG. 3 illustrates a block diagram of the invention's self latching input buffer circuit with respect to column address select circuitry.

FIG. 3 illustrates a block diagram of the invention's self latching input buffer circuit with respect to column address select circuitry. As with the RAS input buffer described above, outputs OUT and OUT_are received by detector 10 which generates latching clock signal 0CAS2.

Figure 1B:
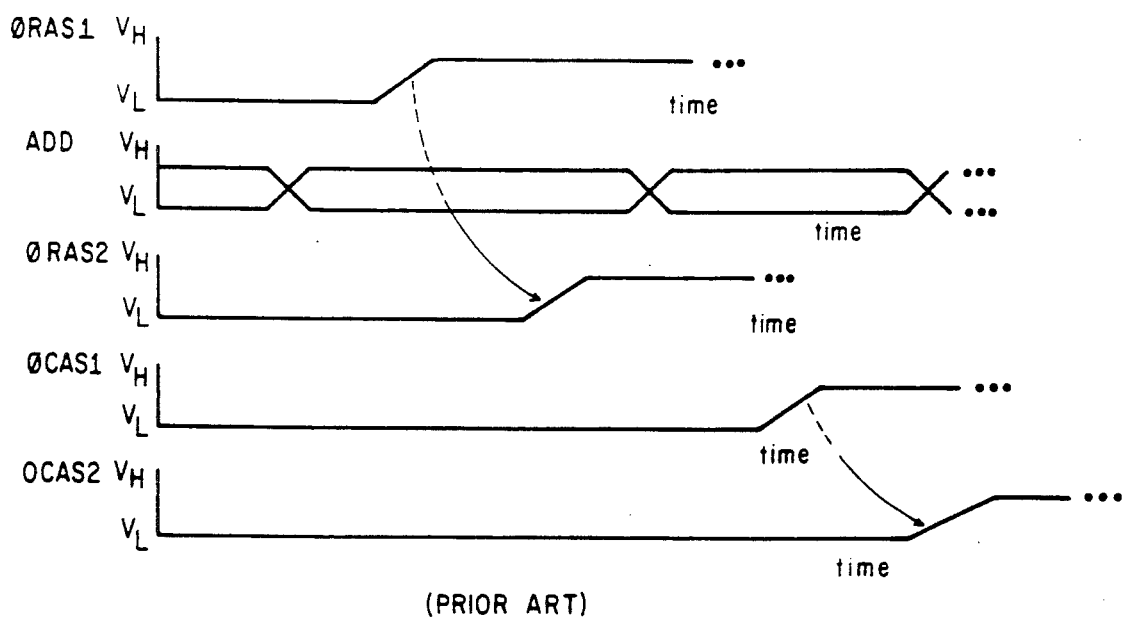
Figure 4:
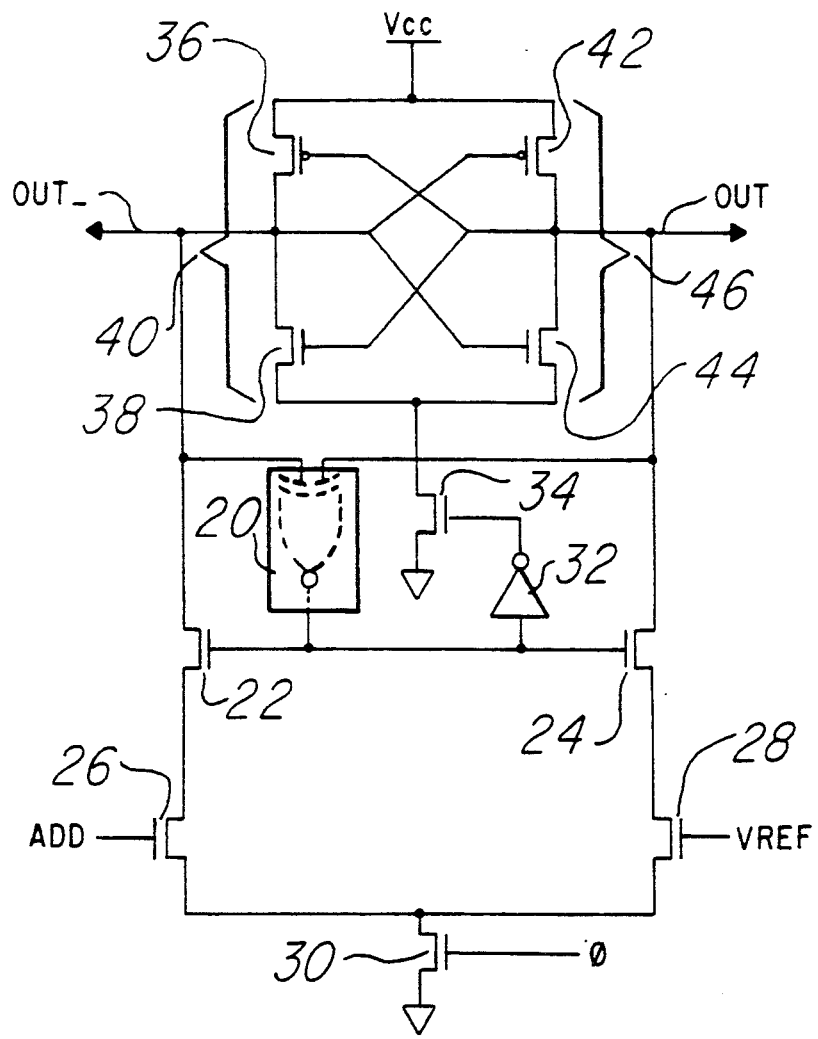
FIG. 4 illustrates a schematic drawing of one implementation of the invention's self latching input buffer circuit as shown in FIGS. 2 or 3.

FIG. 4 illustrates a schematic drawing of one implementation of the invention's self latching input buffer circuit as shown in the block diagrams of FIGS. 2 or 3. At initial operation, signals at outputs OUT and OUT_ are precharged high and input to logic element 20. Logic element 20, connected to the gates of n-channel transistors 22 and 24, outputs a logic high level in response to its two logic high precharged inputs to turn these transistors on. Logic element 20 also functions to turn off transistors 22 and 24 in connection with the receipt of a logic low input. FIG. 4 shows logic element 20 as an exclusive NOR gate. Note, however that an AND gate can be substituted therewith. Additionally, any logic gate configured to produce the above desired function can be used. Thus, an OR, NOR, and NAND gate properly configured can serve as logic element 20. N-channel transistors 26 and 28 connected to the drain of transistors 22 and 24 respectively, are connected by their sources to the drain of pull-down n-channel transistor 30. Transistor 26 receives address signal ADD at its gate while transistor 28 receives reference signal VREF at its gate. After transistors 26 and 28 are turned on by address signal ADD and reference signal VREF, respectively, a logic high level clock signal $\emptyset$, representing either signal ORAS1 or OCAS1 (depending upon whether the circuit is used as a RAS address input buffer or a CAS address input buffer) turns on transistor 30. This results in pulling one of the outputs, OUT on OUT_, low depending upon whether transistor 26 is turned on more strongly than transistor 28. For instance, for the implementation shown in FIG. 4, if transistor 26 is turned on more strongly than transistor 28, OUT_ will be pulled down to a logic low level. However, if transistor 28 is turned on more strongly than transistor 26, then output OUT will be pulled down to a logic low level. With one of the inputs thereto, OUT or OUT_, being low (the other high), logic element 20 in its embodiment as an exclusive NOR gate, will output a logic low level signal to the input of inverter 32 and the gates of transistors 22 and 24. Additionally, this low signal will result in turning transistors 22 and 24 off. Since the output of inverter 32 is connected to the gate of pull-down transistor 34 which as its source connected to circuit ground and its drain connected to cross-coupled (output of each inverter connected to the input of another) inverters 40 (comprising p-channel transistor 36 and n-channel transistor 38) and 46 (comprising p-channel transistor 42 and n-channel transistor 44), transistor 34 turns on to latch the voltage levels at outputs OUT and OUT_. Note that this foregoing described circuit is self-latching, thereby not requiring an external latch signal, such as the clock generated latch signal as discussed with reference to FIGS. 1a and 1b which inherently causes unnecessary delay. The self latching address input buffer circuit need only be used on the RAS circuitry considering the fact that the column signals are much longer than the row signals and are not critical to overall timing, as observed from FIG. 1b. However, in order to conserve power, through the cut-off of transistors 22 and 24, it is advantageous to use the foregoing self-latching input buffer circuit with both RAS and CAS circuitry.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the spirit and true scope of the invention as claimed below.

I claim:

1. An input buffer comprising:
   a latch comprising a first inverter connected to a second inverter,
   a first pull-down device connected to said latch and being operable to latch the outputs of said first and second inverter,
   a third inverter, operable to switch said pull-down device both on and off,
   a first transistor connected to the output of said first inverter,
   a second transistor connected to the output of said second inverter,
   a logic element operable to receive input from said first and second inverter outputs, said logic element being further operable to transmit an output signal to the inputs of said third inverter and said first and second transistors;
   a third transistor connected to said first transistor;
   a fourth transistor connected to said second transistor, and
   a second pull-down device connected to said third and fourth transistors.

2. An input buffer as recited in claim 1 wherein said third transistor is operable to receive a signal corresponding to an address bit, said fourth transistor is operable to receive a reference voltage input and wherein said second pull-down device is operable to receive a clock signal input.

3. An input buffer as recited in claim 1 wherein said first, second, third, and fourth transistors are n-channel transistors.

4. An input buffer as recited in claim 1 wherein said logic element is operable to perform logic selected from the group consisting of an OR, NOR, AND, and NAND operation.

5. An input buffer as recited in claim 1 wherein said first and second inverters each comprises a p-channel transistor connected to an n-channel transistor.

* * * * *